United States Patent
Guard et al.

(10) Patent No.: US 11,086,458 B2
(45) Date of Patent: Aug. 10, 2021

(54) FABRICATED ELECTRICAL CIRCUIT ON TOUCH SENSOR SUBSTRATE

(71) Applicant: BOE Technology Group Co., Ltd., Beijing (CN)

(72) Inventors: David Guard, Fareham (GB); Simon Gillmore, Fareham (GB); Steven Emm, Fareham (GB); Adam O'Callaghan, Fareham (GB)

(73) Assignee: BOE Technology Group Co., Ltd., Beijing (CN)

(*) Notice: Subject to any disclaimer, the term of this patent is extended or adjusted under 35 U.S.C. 154(b) by 0 days.

(21) Appl. No.: 16/540,983

(22) Filed: Aug. 14, 2019

(65) Prior Publication Data
US 2019/0369761 A1    Dec. 5, 2019

Related U.S. Application Data

(63) Continuation of application No. 14/456,960, filed on Aug. 11, 2014, now Pat. No. 10,394,350.

(51) Int. Cl.
*G06F 3/044* (2006.01)
*G06F 3/041* (2006.01)
(Continued)

(52) U.S. Cl.
CPC ............ *G06F 3/0443* (2019.05); *G06F 3/041* (2013.01); *G06F 3/0445* (2019.05); *G06F 3/0446* (2019.05); *H05K 1/189* (2013.01); *G06F 2203/04102* (2013.01); *G06F 2203/04103* (2013.01); *G06F 2203/04112* (2013.01); *H05K 3/284* (2013.01); *H05K 3/323* (2013.01); *H05K 2201/2009* (2013.01); *H05K 2203/0278* (2013.01)

(58) Field of Classification Search
CPC ........... G06F 3/041; G06F 2203/04102; G06F 2203/04103; G06F 2203/04112; H05K 3/284; H05K 3/323; H05K 2201/2009
See application file for complete search history.

(56) References Cited

U.S. PATENT DOCUMENTS 5,847,951 A   12/1998  Brown et al.
6,300,997 B1  10/2001  Saito et al.
(Continued)

FOREIGN PATENT DOCUMENTS

GB    2412790 A    10/2005
WO    201212247 A2  9/2012

OTHER PUBLICATIONS

Myers, S. A. et al., "Electronic Devices With Concave Displays," U.S. Appl. No. 61/454,936, filed Mar. 21, 2011, 23 pages.
(Continued)

*Primary Examiner* — Alexander Eisen
*Assistant Examiner* — Nathaniel P Brittingham
(74) *Attorney, Agent, or Firm* — Banner & Witcott, Ltd.

(57) ABSTRACT

In one embodiment, a device includes a flexible substrate, a touch sensor made of flexible conductive material disposed on the flexible substrate, and conductive tracks made of flexible conductive material disposed on the flexible substrate. The device also includes an electrical component bonded to the conductive tracks. The conductive tracks electrically couple the electrical component to the touch sensor.

17 Claims, 7 Drawing Sheets

(51) Int. Cl.
*H05K 1/18* (2006.01)
*H05K 3/28* (2006.01)
*H05K 3/32* (2006.01)

(56) References Cited

U.S. PATENT DOCUMENTS

| | | | |
|---|---|---|---|
| 6,611,055 B1 | 8/2003 | Hashemi | |
| 6,682,954 B1 | 1/2004 | Ma et al. | |
| 7,663,607 B2 | 2/2010 | Hotelling et al. | |
| 7,864,503 B2 | 1/2011 | Chang | |
| 7,875,814 B2 | 1/2011 | Chen et al. | |
| 7,920,129 B2 | 4/2011 | Hotelling et al. | |
| 8,031,094 B2 | 10/2011 | Hotelling et al. | |
| 8,031,174 B2 | 10/2011 | Hamblin et al. | |
| 8,040,326 B2 | 10/2011 | Hotelling et al. | |
| 8,049,732 B2 | 11/2011 | Hotelling et al. | |
| 8,179,381 B2 | 5/2012 | Frey et al. | |
| 8,217,902 B2 | 7/2012 | Chang et al. | |
| 8,723,824 B2 | 5/2014 | Myers et al. | |
| 9,661,114 B2 | 5/2017 | Jeong et al. | |
| 2001/0030060 A1 | 10/2001 | Carroll | |
| 2006/0148297 A1 | 7/2006 | Ma | |
| 2006/0274055 A1 | 12/2006 | Reynolds et al. | |
| 2007/0285406 A1* | 12/2007 | Kukulj | G02B 6/1221 345/176 |
| 2008/0096312 A1 | 4/2008 | Law et al. | |
| 2008/0179756 A1 | 7/2008 | Kamins et al. | |
| 2008/0180399 A1 | 7/2008 | Cheng | |
| 2008/0303782 A1 | 12/2008 | Grant et al. | |
| 2008/0309635 A1 | 12/2008 | Matsuo | |
| 2009/0002339 A1 | 1/2009 | Reynolds et al. | |
| 2009/0140871 A1 | 6/2009 | Titus | |
| 2009/0219257 A1 | 9/2009 | Frey et al. | |
| 2009/0315854 A1 | 12/2009 | Matsuo | |
| 2011/0095999 A1 | 4/2011 | Hayton | |
| 2011/0316131 A1 | 12/2011 | Fukuda et al. | |
| 2012/0068968 A1 | 3/2012 | Reynolds et al. | |
| 2012/0242588 A1 | 9/2012 | Myers et al. | |
| 2012/0242592 A1 | 9/2012 | Rothkopf et al. | |
| 2012/0243151 A1 | 9/2012 | Lynch | |
| 2012/0243719 A1 | 9/2012 | Franklin et al. | |
| 2012/0287582 A1 | 11/2012 | Vinciarelli et al. | |
| 2013/0076612 A1 | 3/2013 | Myers | |
| 2013/0083496 A1 | 4/2013 | Franklin et al. | |
| 2013/0100038 A1* | 4/2013 | Yilmaz | G06F 3/044 345/173 |
| 2013/0106441 A1 | 5/2013 | Yilmaz et al. | |
| 2013/0127772 A1* | 5/2013 | Guard | G06F 3/044 345/174 |
| 2013/0222325 A1* | 8/2013 | Cok | G06F 3/044 345/174 |
| 2013/0293096 A1 | 11/2013 | Kang et al. | |
| 2014/0078705 A1* | 3/2014 | Jo | H05K 7/02 361/767 |
| 2014/0253830 A1 | 9/2014 | Li et al. | |
| 2015/0043176 A1 | 2/2015 | Ahn | |
| 2015/0047957 A1 | 2/2015 | Tokuno et al. | |
| 2015/0084909 A1* | 3/2015 | Worfolk | G06F 3/0414 345/174 |
| 2015/0169116 A1* | 6/2015 | Masuda | G06F 3/044 345/174 |
| 2015/0199048 A1 | 7/2015 | Monson et al. | |
| 2015/0207102 A1 | 7/2015 | Jeong et al. | |
| 2015/0305138 A1 | 10/2015 | Tombs et al. | |
| 2015/0309622 A1 | 10/2015 | Huang | |
| 2015/0382446 A1 | 12/2015 | Kwon et al. | |

OTHER PUBLICATIONS

Lynch, S. B., "Electronic Devices With Convex Displays," U.S. Appl. No. 61/454,950, filed Mar. 21, 2011, 28 pages.

Rothkopf, F. R. et al., "Electronic Devices With Flexible Displays," U.S. Appl. No. 61/454,894, filed Mar. 21, 2011, 41 pages.

* cited by examiner

FABRICATED ELECTRICAL CIRCUIT ON TOUCH SENSOR SUBSTRATE

RELATED APPLICATION

This application is a continuation under 35 U.S.C. § 120 of U.S. application Ser. No. 14/456,960 filed Aug. 11, 2014 and entitled Fabricated Electrical Circuit on Touch Sensor Substrate, incorporated herein by reference.

TECHNICAL FIELD

This disclosure generally relates to touch sensors.

BACKGROUND

A touch sensor may detect the presence and location of a touch or the proximity of an object (such as a user's finger or a stylus) within a touch-sensitive area of the touch sensor overlaid on a display screen, for example. In a touch-sensitive-display application, the touch sensor may enable a user to interact directly with what is displayed on the screen, rather than indirectly with a mouse or touch pad. A touch sensor may be attached to or provided as part of a desktop computer, laptop computer, tablet computer, personal digital assistant (PDA), smartphone, satellite navigation device, portable media player, portable game console, kiosk computer, point-of-sale device, or other suitable device. A control panel on a household or other appliance may include a touch sensor.

There are a number of different types of touch sensors, such as (for example) resistive touch screens, surface acoustic wave touch screens, and capacitive touch screens. Herein, reference to a touch sensor may encompass a touch screen, and vice versa, where appropriate. When an object touches or comes within proximity of the surface of the capacitive touch screen, a change in capacitance may occur within the touch screen at the location of the touch or proximity. A touch-sensor controller may process the change in capacitance to determine its position on the touch screen.

DESCRIPTION OF EXAMPLE EMBODIMENTS

Figure 1:
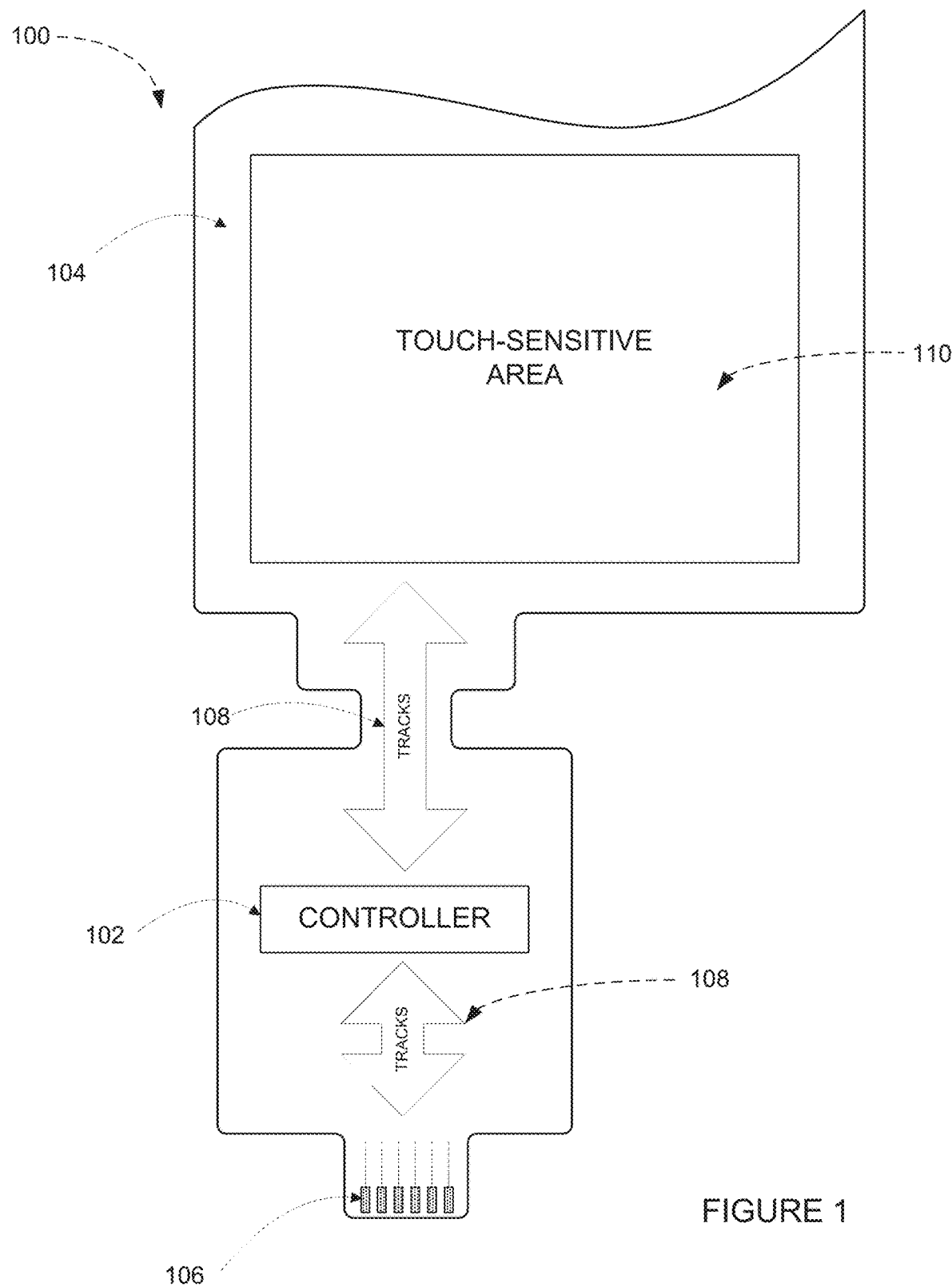
FIG. 1 illustrates an example touch sensor.

FIG. 1 illustrates touch sensor 100. In the example of FIG. 1, touch sensor 100 comprises touch-sensor controller 102. Touch sensor 100 and touch-sensor controller 102 may detect the presence and location of a touch or the proximity of an object within a touch-sensitive area of touch sensor 100. Herein, reference to a touch sensor may encompass both the touch sensor and its touch-sensor controller, where appropriate. Similarly, reference to a touch-sensor controller may encompass both the touch-sensor controller and its touch sensor, where appropriate. Touch sensor 100 may include one or more touch-sensitive areas, where appropriate. As an example of FIG. 1 and not by way of limitation, touch sensor 100 may include touch-sensitive area 110. Touch-sensitive area 110 may include an array of drive and sense electrodes (or an array of electrodes of a single type) disposed on one or more substrates, which may be made of a dielectric material. As an example of FIG. 1 and not by way of limitation, touch-sensitive area 110 may be disposed on substrate 104. In particular embodiments, the one or more substrates may be flexible. As an example and not by way of limitation, the minimum bend radius for the one or more substrate may be at least approximately 1.5 mm. Herein, reference to a touch sensor may encompass both the electrodes of the touch sensor and the substrate(s) that they are disposed on, where appropriate. Alternatively, where appropriate, reference to a touch sensor may encompass the electrodes of the touch sensor, but not the substrate(s) that they are disposed on.

An electrode (whether a ground electrode, a guard electrode, a drive electrode, or a sense electrode) may be an area of conductive material forming a shape, such as for example a disc, square, rectangle, thin line, other suitable shape, or suitable combination of these. One or more cuts in one or more layers of conductive material may (at least in part) create the shape of an electrode, and the area of the shape may (at least in part) be bounded by those cuts. In particular embodiments, the conductive material of an electrode may occupy approximately 100% of the area of its shape. As an example and not by way of limitation, an electrode may be made of indium tin oxide (ITO) and the ITO of the electrode may occupy approximately 100% of the area of its shape (sometimes referred to as 100% fill), where appropriate. In particular embodiments, the conductive material of an electrode may occupy substantially less than 100% of the area of its shape. As an example and not by way of limitation, an electrode may be made of fine lines of metal or other conductive material (FLM), such as for example copper, silver, carbon, or a copper-, silver-, or carbon-based material, and the fine lines of conductive material may occupy approximately 5% of the area of its shape in a hatched, mesh (as described below), or other suitable pattern. Herein, reference to FLM encompasses such material, where appropriate. Although this disclosure describes or illustrates particular electrodes made of particular conductive material forming particular shapes with particular fill percentages having particular patterns, this disclosure contemplates any suitable electrodes made of any suitable conductive material forming any suitable shapes with any suitable fill percentages having any suitable patterns. As an example and not by way of limitation, the conductive material(s) of the electrodes may be flexible.

Where appropriate, the shapes of the electrodes (or other elements) of a touch sensor may constitute in whole or in part one or more macro-features of the touch sensor. One or more characteristics of the implementation of those shapes (such as, for example, the conductive materials, fills, or patterns within the shapes) may constitute in whole or in part one or more micro-features of the touch sensor. One or more macro-features of a touch sensor may determine one or more characteristics of its functionality, and one or more micro-features of the touch sensor may determine one or more optical features of the touch sensor, such as transmittance, refraction, or reflection.

A mechanical stack may contain the substrate (or multiple substrates) and the conductive material forming the drive or sense electrodes of touch sensor 100. As an example and not by way of limitation, the mechanical stack may include a first layer of optically clear adhesive (OCA) beneath a cover panel. The cover panel may be clear and made of a resilient material suitable for repeated touching, such as for example glass, polycarbonate, or poly(methyl methacrylate) (PMMA). This disclosure contemplates any suitable cover panel made of any suitable material. The first layer of OCA may be disposed between the cover panel and the substrate with the conductive material forming the drive or sense electrodes. The mechanical stack may also include a second layer of OCA and a dielectric layer (which may be made of polyethylene terephthalate (PET) or another suitable material, similar to the substrate with the conductive material forming the drive or sense electrodes). As an alternative, where appropriate, a thin coating of a dielectric material may be applied instead of the second layer of OCA and the dielectric layer. In particular embodiments, the thin coating of the dielectric material may be thicker than approximately 3 µm. In particular embodiments, the thin coating may possess particular optical qualities such as for example, smooth and low haze. The second layer of OCA may be disposed between the substrate with the conductive material making up the drive or sense electrodes and the dielectric layer, and the dielectric layer may be disposed between the second layer of OCA and an air gap to a display of a device including touch sensor 100. As an example only and not by way of limitation, the cover panel may have a thickness of approximately 1 mm; the first layer of OCA may have a thickness of approximately 0.05 mm; the substrate with the conductive material forming the drive or sense electrodes may have a thickness of approximately 0.05 mm; the second layer of OCA may have a thickness of approximately 0.05 mm; and the dielectric layer may have a thickness of approximately 0.05 mm. Although this disclosure describes a particular mechanical stack with a particular number of particular layers made of particular materials and having particular thicknesses, this disclosure contemplates any suitable mechanical stack with any suitable number of any suitable layers made of any suitable materials and having any suitable thicknesses. As an example and not by way of limitation, in particular embodiments, a layer of adhesive or dielectric may replace the dielectric layer, second layer of OCA, and air gap described above, with there being no air gap to the display.

One or more portions of substrate 104 may be made of PET or another suitable material. This disclosure contemplates any suitable substrate with any suitable portions made of any suitable material. In particular embodiments, substrate 104 may be made of a low-birefringence material, such as for example, cyclic olefin polymer (COP), cyclic olefin copolymer (COC), cyclic block copolymer (CBC), tri-acetate cellulose (TAC), polyethersulfone (PES), fiber-reinforced plastic (FRP), some forms of polycarbonate, glass (see e.g., fused silica), or any other suitable material or suitable combination of materials having low birefringence. In particular embodiments, the drive or sense electrodes in touch-sensitive area 110 may be made of ITO in whole or in part. In particular embodiments, the drive or sense electrodes in touch-sensitive area 110 may be made of fine lines of metal or other conductive material. As an example and not by way of limitation, one or more portions of the conductive material may be copper or copper-based and have a thickness of approximately 5 µm or less and a width of approximately 10 µm or less. As another example, one or more portions of the conductive material may be silver or silver-based and similarly have a thickness of approximately 5 µm or less and a width of approximately 10 µm or less. As yet another example, one or more portions of the conductive material may be carbon or carbon-based and similarly have a thickness of approximately 5 µm or less and a width of approximately 10 µm or less. This disclosure contemplates any suitable electrodes made of any suitable material.

Touch sensor 100 may implement a capacitive form of touch sensing. In a mutual-capacitance implementation, touch-sensitive area 110 may include an array of drive and sense electrodes forming an array of capacitive nodes. A drive electrode and a sense electrode may form a capacitive node. The drive and sense electrodes forming the capacitive node may come near each other, but not make electrical contact with each other. Instead, the drive and sense electrodes may be capacitively coupled to each other across a space between them. A pulsed or alternating voltage applied to the drive electrode (by touch-sensor controller 102) may induce a charge on the sense electrode, and the amount of charge induced may be susceptible to external influence (such as a touch or the proximity of an object). When an object touches or comes within proximity of the capacitive node, a change in capacitance may occur at the capacitive node and touch-sensor controller 102 may measure the change in capacitance. By measuring changes in capacitance throughout the array, touch-sensor controller 102 may determine the position of the touch or proximity within touch-sensitive area 110 of touch sensor 100.

In a self-capacitance implementation, touch-sensitive area 110 may include an array of electrodes of a single type that may each form a capacitive node. When an object touches or comes within proximity of the capacitive node, a change in self-capacitance may occur at the capacitive node and touch-sensor controller 102 may measure the change in capacitance, for example, as a change in the amount of charge needed to raise the voltage at the capacitive node by a pre-determined amount. As with a mutual-capacitance implementation, by measuring changes in capacitance throughout the array, touch-sensor controller 102 may determine the position of the touch or proximity within touch-sensitive area 110 of touch sensor 100. This disclosure contemplates any suitable form of capacitive touch sensing, where appropriate.

In particular embodiments, one or more drive electrodes may together form a drive electrode line running horizontally or vertically or in any suitable orientation. Similarly, one or more sense electrodes may together form a sense electrode line running horizontally or vertically or in any suitable orientation. Additionally, one or more ground electrodes may together form a ground electrode line running horizontally or vertically or in any suitable orientation. In particular embodiments, drive electrode lines may run substantially perpendicular to sense electrode lines. In particular embodiments, drive electrode lines may run substantially parallel to sense electrode lines. Herein, reference to a drive electrode line may encompass one or more drive electrodes making up the drive electrode line, and vice versa, where appropriate. Similarly, reference to a sense electrode line may encompass one or more sense electrodes making up the sense electrode line, and vice versa, where appropriate. Additionally, reference to a ground electrode line may encompass one or more ground electrodes making up the ground electrode line, and vice versa, where appropriate. In particular embodiments, any electrode may be configured as a drive, sense, or ground electrode and the configuration of any electrode may be changed during operation of touch sensor 100. In particular embodiments, configuration of electrodes may be controlled by touch-sensor controller 102.

Touch sensor 100 may have drive and sense electrodes disposed in a pattern on one side of a single substrate. In such a configuration, a pair of drive and sense electrodes capacitively coupled to each other across a space between them may form a capacitive node. For a self-capacitance implementation, electrodes of only a single type may be disposed in a pattern on a single substrate. In addition or as an alternative to having drive and sense electrodes disposed in a pattern on one side of a single substrate, touch sensor 100 may have drive electrodes disposed in a pattern on one side of a substrate and sense electrodes disposed in a pattern on another side of the substrate. Moreover, touch sensor 100 may have drive electrodes disposed in a pattern on one side of one substrate and sense electrodes disposed in a pattern on one side of another substrate. In such configurations, an intersection of a drive electrode and a sense electrode may form a capacitive node. Such an intersection may be a location where the drive electrode and the sense electrode "cross" or come nearest each other in their respective planes. The drive and sense electrodes do not make electrical contact with each other instead they are capacitively coupled to each other across a dielectric at the intersection. Although this disclosure describes particular configurations of particular electrodes forming particular nodes, this disclosure contemplates any suitable configuration of any suitable electrodes forming any suitable nodes. Moreover, this disclosure contemplates any suitable electrodes disposed on any suitable number of any suitable substrates in any suitable patterns.

In particular embodiments, touch sensor 100 may determine the position of an object (such as a stylus or a user's finger or hand) that makes physical contact with touch-sensitive area 110. In addition or as an alternative, in particular embodiments, touch sensor 100 may determine the position of an object that comes within proximity of touch-sensitive area 110 without necessarily contacting touch-sensitive area 110. In particular embodiments, an object may come within proximity of touch-sensitive area 110 when it is located some distance above a surface of touch-sensitive area 110; when it hovers in a particular position above a surface of touch-sensitive area 110; when it makes a motion (such as for example a swiping motion or an air gesture) above a surface of touch-sensitive area 110; or any suitable combination of the above. In particular embodiments, determining the position of an object that comes within proximity of touch-sensitive area 110 without making physical contact may be referred to as determining the proximity of an object. In particular embodiments, determining the proximity of an object may comprise determining the position of an object's projection onto touch-sensitive area 110 when the object is located some distance above a plane of touch-sensitive area 110. The projection of an object onto touch-sensitive area 110 may be made along an axis that is substantially orthogonal to a plane of touch-sensitive area 110. In particular embodiments, the position of an object's projection onto touch-sensitive area 110 may be referred to as the position or the location of an object. As an example and not by way of limitation, touch sensor 100 may determine the position of an object when the object is located above the surface of touch-sensitive area 110 and within a distance of approximately 20 mm of the surface of touch-sensitive area 110. Although this disclosure describes or illustrates particular touch sensors 100 that may determine a position of physical contact of an object, a proximity of an object, or a combination of the two, this disclosure contemplates any suitable touch sensor 100 suitably configured to determine a position of physical contact of an object, a proximity of an object, or any suitable combination of one or more of the above.

As described above, a change in capacitance at a capacitive node of touch-sensitive area 110 may indicate a touch or proximity input at the position of the capacitive node. Touch-sensor controller 102 may detect and process the change in capacitance to determine the presence and location of the touch or proximity input. Touch-sensor controller 102 may then communicate information about the touch or proximity input to one or more other components (such one or more central processing units (CPUs)) of a device that includes touch sensor 100 and touch-sensor controller 102, which may respond to the touch or proximity input by initiating a function of the device (or an application running on the device). Although this disclosure describes a particular touch-sensor controller having particular functionality with respect to a particular device and a particular touch sensor, this disclosure contemplates any suitable touch-sensor controller having any suitable functionality with respect to any suitable device and any suitable touch sensor.

Touch-sensor controller 102 may be one or more integrated circuits (ICs), such as for example general-purpose microprocessors, microcontrollers, programmable logic devices or arrays, application-specific ICs (ASICs). In particular embodiments, touch-sensor controller 102 comprises analog circuitry, digital logic, and digital non-volatile memory. In particular embodiments, touch-sensor controller 102 is disposed on a flexible printed circuit (FPC) bonded to a substrate of touch sensor 100. The FPC may be active or passive, where appropriate. In other particular embodiments, multiple touch-sensor controllers 102 are disposed on the FPC. In yet other particular embodiments, one or more touch-sensor controllers 102 are disposed on substrate(s) of touch sensor 100. As an example of FIG. 1 and not by way of limitation, touch-sensor controller 102 may be disposed on substrate 104 of touch sensor 100. Herein, reference to an area of substrate(s) that encompasses one or more touch-sensitive areas may be referred to as a main portion of the substrate(s), and vice versa, where appropriate. Furthermore, reference to an area of substrate(s) that encompasses one or more touch-sensor controllers may be referred to as a tail portion of the substrate(s), and vice versa, where appropriate. Touch-sensor controller 102 may include a processor unit, a drive unit, a sense unit, and a storage unit. The drive unit may supply drive signals to the drive electrodes of touch-sensitive area 110. The sense unit may sense charge at the capacitive nodes of touch-sensitive area 110 and provide measurement signals to the processor unit representing capacitances at the capacitive nodes. The processor unit may control the supply of drive signals to the drive electrodes by the drive unit and process measurement signals from the sense unit to detect and process the presence and location of a touch or proximity input within touch-sensitive area 110 of touch sensor 100. The processor unit may also track changes in the position of a touch or proximity input within touch-sensitive area 110 of touch sensor 100. The storage unit may store programming for execution by the processor unit, including programming for controlling the drive unit to supply drive signals to the drive electrodes, programming for processing measurement signals from the sense unit, and other suitable programming, where appropriate. Although this disclosure describes a particular touch-sensor controller having a particular implementation with particular components, this disclosure contemplates any suitable touch-sensor controller having any suitable implementation with any suitable components.

Tracks 108 may be made of conductive material disposed on substrate 104. Tracks 108 may come in different widths. In particular embodiments, tracks 108 may be made of flexible conductive material. As an example and not by way of limitation, the minimum bend radius for the flexible conductive material may be at least approximately 1.5 mm. Wider tracks may be used to form bonding pads for mounting electrical component on substrate 104. Herein, reference to tracks may encompass bonding pads, and vice versa, where appropriate. Moreover, tracks 108 may couple various components of touch sensor 100. As an example of FIG. 1 and not by way of limitation, tracks 108 may couple the drive or sense electrodes of touch-sensitive area 110 to touch-sensor controller 102, also disposed on substrate 104. Tracks 108 may also couple touch-sensor controller 102 to connection pads 106, also disposed on substrate 104. In particular embodiments, tracks 108 may even couple the drive or sense electrodes of touch-sensitive area 110 to connection pads 106 directly. As described below, connection pads 16 facilitate coupling of tracks 108 to one or more other components (such one or more central processing units (CPUs)) of a device that includes touch sensor 100.

Tracks 108 may extend into or around (e.g. at the edges of) touch-sensitive area 110 of touch sensor 100. Tracks 108 may provide drive connections for coupling touch-sensor controller 102 to drive electrodes of touch-sensitive area 110, through which the drive unit of touch-sensor controller 102 may supply drive signals to the drive electrodes. Other tracks 108 may provide sense connections for coupling touch-sensor controller 102 to sense electrodes of touch-sensitive area 110, through which the sense unit of touch-sensor controller 102 may sense charge at the capacitive nodes of touch-sensitive area 110. Tracks 108 may be made of fine lines of metal or other conductive material. As an example and not by way of limitation, the conductive material of tracks 108 may be copper or copper-based and have a width of approximately 100 μm or less. As another example, the conductive material of tracks 108 may be silver or silver-based and have a width of approximately 100 μm or less. As yet another example, the conductive material of tracks 108 may be carbon or carbon-based and have a width of approximately 100 μm or less. In particular embodiments, tracks 108 may be made of ITO in whole or in part in addition or as an alternative to fine lines of metal or other conductive material. Although this disclosure describes particular tracks made of particular materials with particular widths, this disclosure contemplates any suitable tracks made of any suitable materials with any suitable widths. In addition to tracks 108, touch sensor 100 may include one or more ground electrode lines terminating at a ground connector (which may be a connection pad 106) at an edge of substrate 104 (similar to tracks 108).

Connection pads 16 may be located along one or more edges of substrate 104 of touch sensor 100. As described above, touch-sensor controller 102 may be on substrate 104, Connection pads 106 may be made of the same material as tracks 108. In particular embodiments, connection pads 16 may be connected to an electro-mechanical connector (such as a zero-insertion-force (ZIF) wire-to-board connector). This disclosure contemplates any suitable connector between touch sensor 100 and one or more other components (such one or more central processing units (CPUs)) of a device that includes touch sensor 100.

Figure 2A:
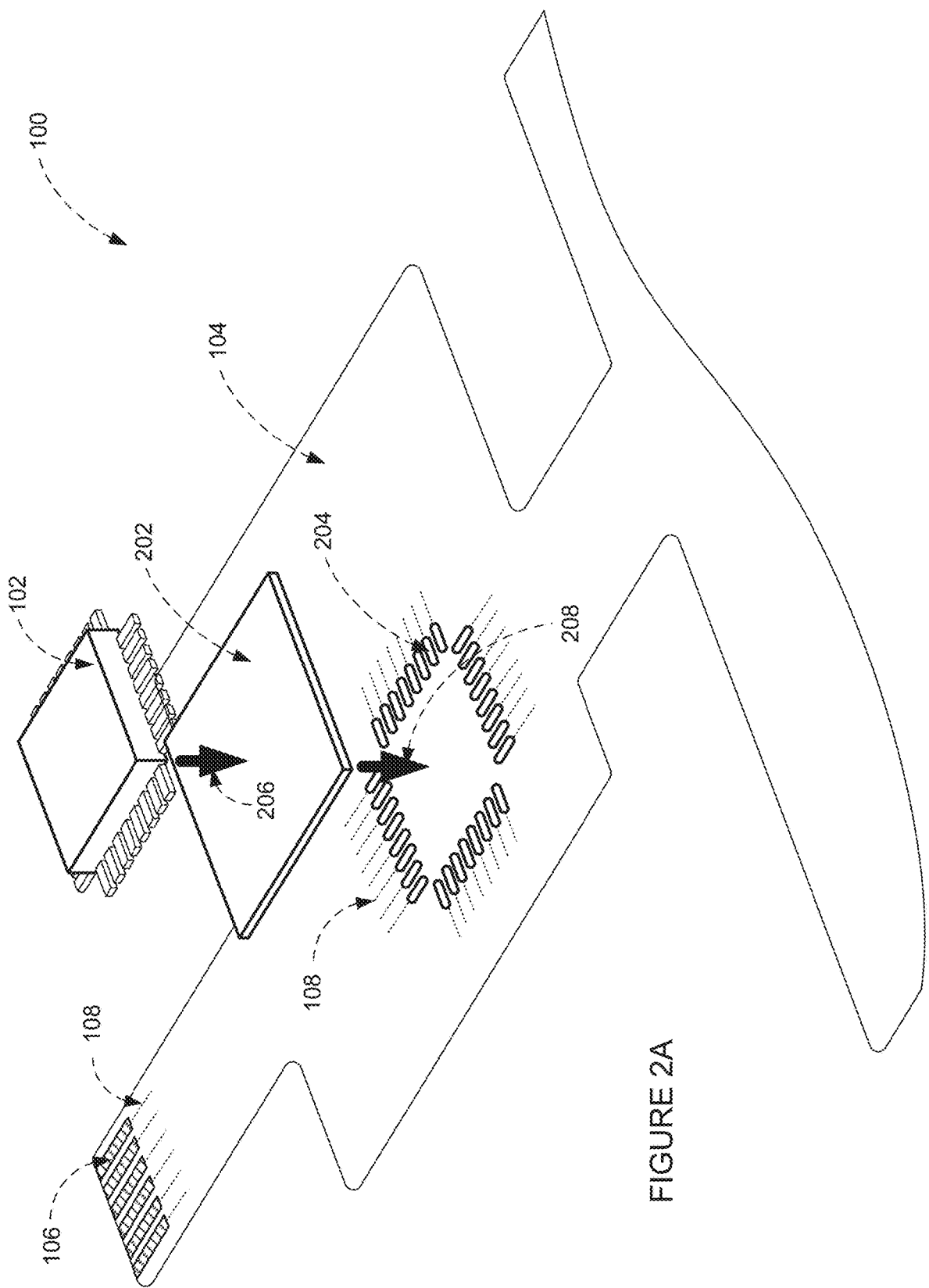
FIG. 2A illustrates an example three-dimensional view of touch sensor of FIG. 1 where touch-sensor controller is bonded to substrate of the touch sensor.

FIG. 2A (not necessarily shown to scale) illustrates an example three-dimensional view of touch sensor 100 where touch-sensor controller 102 is bonded to substrate 104 of touch sensor 100. In the example of FIG. 2A, touch sensor 100 comprises a single-layer configuration with electrodes disposed only on one surface of the flexible substrate. As another example and not by way of limitation, touch sensor 100 may comprise a double-layer configuration with one or more electrodes disposed on a first surface of the flexible substrate and one or more electrodes disposed on a second surface of the flexible substrate opposite the first surface. Touch sensor 100 having a double-layer configuration may comprise one or more vias. Vias are electrically conductive openings made through substrate 104, through which tracks 108 may pass, so that they may continue along the opposite surface of substrate 104 from the electrodes. As an example and not by way of limitation, one or more electrically conductive vias disposed through substrate 104 may electrically couple conductive material formed on an outward-facing surface of substrate 104 with conductive material formed on an inward-facing surface of substrate 104. As another example and not by way of limitation, touch-sensor 100 may be encapsulated between a glass cover panel and a second dielectric layer (which may be made of polyethylene terephthalate (PET) or another suitable material, similar to the substrate with the conductive material forming the drive or sense electrodes). Accordingly, vias may be formed under the glass cover panel where the glass cover panel acts as an environmental barrier for the vias. As such, the vias may electrically couple conductive material (i.e. tracks 108) on one side of a substrate (where touch-sensor controller 102 is located) to the other side of the substrate. As an example and not by way of limitation, the vias may electrically couple tracks 108 from the side of substrate 104 closest to the glass cover panel to the opposite side of substrate 104 where touch-sensor controller 102 is bonded to substrate 104. Although this disclosure describes vias for electrically coupling conductive materials between particular surfaces of substrate 104, this disclosure contemplates any suitable electrical interconnects for electrically coupling conductive materials between any suitable surfaces of any suitable substrate of any suitable touch sensor in any suitable manner.

In particular embodiments, substrate 104 may be made of PET, as described above. In other embodiments, substrate 104 may be made of a low-birefringence material, as further described above. Furthermore, substrate 104 may possess a particular thickness. As an example and not by way of limitation, the thickness of substrate 104 may be substantially equivalent to 50 μm. As another example and not by way of limitation, the thickness of substrate 104 may be substantially between 50 μm and 200 μm. Although this disclosure describe particular substrate of touch sensor 100 in a particular manner, this disclosure contemplates any suitable substrate of touch sensor 100 made of any suitable combination of one or more of any suitable material in any suitable manner.

In the example of FIG. 2A, tracks 108 of conductive material may interconnect various components of touch sensor 100. Furthermore, tracks 108 may encompass traces (not shown in FIG. 2A) and bonding pads. Traces may primarily deliver current between various electrical components on substrate 104. In addition to delivering current between various electrical components on substrate 104, bonding pads may bond electrical components to substrate 104. As an example of FIG. 2A and not by way of limitation, bonding pads 204 may bond the pins of touch-sensor controller 102 to substrate 104. The pins of touch-sensor controller 102 may comprise input/output (I/O) pins and power pins. In particular embodiments, bonding pads may be formed from tracks 108. As an example of FIG. 2A and not by way of limitation, bonding pads 204 may be formed of the same conductive material as tracks 108 and may possess pre-determined widths and thicknesses. As another example of FIG. 2A and not by way of limitation, bonding pads 204 may be substantially wider and thicker than traces of tracks 108 for better conductivity with and mechanical support of the bonded electrical component(s). In particular embodiments, the traces and bonding pads 204 may be made of FLM, as described above. In other particular embodiments, at least some of the conductive material is copper, silver, carbon, copper-based, silver-based, or carbon-based, as further described above. Although this disclosure describes and illustrates tracks 108 of touch sensor 100 comprising particular traces and particular bonding pads, the disclosure contemplates tracks 108 of touch sensor 100 comprising any suitable combination of one or more suitable electrical interconnects. Moreover, although this disclosure describes and illustrates particular bonding pads for bonding electrical components to substrate 104 in a particular manner, this disclosure contemplates any suitable electrical interconnects for bonding electrical components to any suitable substrate of any suitable touch sensor in any suitable manner. As an example and not by way of limitation, traces of tracks 108 may be used to bond the electrical components to substrate 104.

In the example of FIG. 2A, bonding pads 204 may be bonded to the pins of touch-sensor controller 102. As such, bonding pads 204 may be arranged on substrate 104 in a pattern associated with the pins of touch-sensor controller 102. As an example of FIG. 2A and not by way of limitation, touch-sensor controller 102 has a quad-flat no-leads (QFN) packaging footprint. As such, bonding pads 204 may be arranged in association with the QFN packaging footprint. As another example and not by way of limitation, touch-sensor controller 102 (or any other active electrical component) may have a ball-grid array (BGA) packaging footprint. As such, bonding pads 204 may be arranged in association with the BGA packaging footprint. In addition, bonding pads 204 may be bonded to the pins of touch-sensor controller 102 using an anisotropic conductive film (ACF) 202. ACF 202 is a heat-treatable and electrically conductive adhesive film used for coupling various components electrically and mechanically. ACF 202 may contain conductive particles of various particle sizes and distributions within an epoxy-based resin. The conductive particles may be configured to form electrical interconnects within certain parts of the adhesive film. The conductive particles may also be configured to be electrically insulating in other parts of the adhesive firm. In the example of FIG. 2A, ACF 202 may be trimmed to particular shape and size associated with one or more features of the electrical component to be bonded (such as for example square-outline of touch-sensor controller 102 encompassing the pins). Accordingly, as indicated by arrow 208, ACF 202 may be pressed on substrate 104 and the associated bonding pads 204. Next, as indicated by arrow 206, touch-sensor controller 102 may be pressed on ACF 202 where each pin (of touch-sensor controller 102) may be properly aligned with the associated bonding pad 204 on substrate 104. Although this disclosure describes and illustrates ACF 202 for bonding particular electrical component to particular substrate of particular touch sensor, this disclosure contemplates any suitable adhesive and conductive material for bonding any suitable electrical component to any suitable substrate of any suitable touch sensor in any suitable manner. As an example and not by way of limitation, anisotropic conductive paste (ACP) may be used to bond touch-sensor controller 102 to substrate 104. ACP may be formed from the main ingredient materials of ACF 202. As such, ACP may share certain key characteristics of ACT 202, such as for example adhesiveness and electrically conductive (in configurable sub-portions). Furthermore, ACP may exist in paste form at room temperature. Accordingly, ACP may be selectively applied (such as for example, screen printed) to particular portions of substrate 104 (such as for example bonding pads 204) for bonding substrate 104 with touch-sensor controller 102. As another example and not by way of limitation, a conductive epoxy-base resin, such as for example silver-filled epoxy, may be used for bonding touch-sensor controller 102 to substrate 104.

Moreover, although this disclosure describes and illustrates touch-sensor controller 102 being bonded to particular tracks and particular substrate of touch sensor 100, this disclosure contemplates any suitable electrical component being bonded to any suitable tracks and any suitable substrate (associated with the tracks) of any suitable touch sensor. The electrical component being bonded may comprise an active electrical component, a passive electrical component, or even a third-party printed circuit board (PCB) or FPC. In particular embodiments, the active electrical component as bonded may require one or more vias in the substrate. The number of vias may depend at least on a pin (such as for example, signal pin and power pin) density of the bonded active electrical component, type of pins of the bonded active electrical component, a component density on substrate 104, size of substrate 104, or configuration of the active electrical component. As an example of an active electrical component and by way of limitation, any suitable integrated circuit (IC) encased in packaging with pins for electrically coupling the IC to the conductive tracks may be electrically and mechanically bonded to the tracks and associated substrate. As an example of a passive electrical component and by of limitation, any suitable discrete component (such as for example a capacitor or a resistor) may be electrically and mechanically bonded to the tracks and associated substrate. In particular embodiments, tracks 108 may be configured to comprise a pattern of interleaving fingers with very small separation between the fingers as interleaved. As an example and not by way of limitation, a power decoupling capacitor may be bonded to two of the interleaved fingers as described above. As another example and not by way of limitation, the size of the separation between any two neighboring interleaved fingers may depend at least on a packaging footprint descriptor of the discrete component (such as for example 0402, 0603, or 0805). As another example of a passive electrical component and by way of limitation, any suitable electrical connector may be electrically and mechanically bonded to the tracks and associated substrate. In particular embodiments, the electrical connector may be bonded to tracks 108 at an edge of substrate 104. As an example and not by way of limitation, the electrical connector may be a flexible ribbon cable bonded to substrate 104 using ACF 202.

Touch-sensor controller 102 may be bonded to a predetermined portion of substrate 104 of touch sensor 100. As an example of FIG. 2A and not by way of limitation, touch-sensor controller 102 may be bonded to a tail-end portion of substrate 104 of touch sensor 100. At the same time, the main portion of touch sensor 100 may be located above a display (not shown in FIG. 2A) of a device comprising touch sensor 100. In particular embodiments, the tail-end portion of touch sensor 100 may comprise touch-sensor controller 102 and other associated electrical components that are bonded to substrate 104 of touch sensor 100. As such, touch-sensor controller 102 and the other associated electrical components may form electrical circuitry in addition to the electrodes of touch sensor 100. In other particular embodiments, the tail-end portion of touch sensor 100 may be bonded to an external PCB, an external FPC, or a flexible ribbon cable, as described above. In yet other particular embodiments, the tail-end portion of touch sensor 100 may be clamped to an external ZIF connector. Although this disclosure describes and illustrates particular electrical component(s) being bonded to particular portion of substrate 104 of touch sensor 100, this disclosure contemplates any suitable electrical component(s) being bonded to one or more of any suitable portions of substrate 104 of touch sensor 100 in any suitable manner.

In particular embodiments, bonding electrical component(s) (such as for example touch-sensor controller 102) directly to substrate of any touch sensor may reduce overall cost of the touch-sensor assembly. As an example of FIG. 2A and not by way of limitation, bonding touch-sensor controller 102 and its associated electrical components directly to substrate 104 of touch sensor 100, instead of bonding touch-sensor controller 102 and the associated electrical components to an external PCB (or FPC) and attaching the external PCB (or FPC) to touch sensor 100, may reduce component count of the touch-sensor assembly by removing the external PCB (or FPC). Furthermore, the reduced component count may reduce an overall cost and associated manufacturing costs of the touch-sensor assembly. In particular embodiments, bonding electrical component(s) (such as for example touch-sensor controller 102) directly to substrate of any touch sensor may improve performance of the touch sensor. As an example of FIG. 2A and not by way of limitation, the improvement in performance of touch sensor 100 may be accomplished by reducing travel distance of electrical currents between touch-sensor controller 102 and various associated electrical components on touch sensor 100. The shorter travel distance of electrical currents may reduce charge times and electrical noise (as imposed on interconnects between touch-sensor controller 102 and its associated electrical components of touch sensor 100). As another example of FIG. 2A and not by way of limitation, the improvement in performance of touch sensor may be accomplished by reducing a number of intermediate electrical components between touch-sensor controller 102 and various other associated electrical components on touch sensor 100. In particular embodiments, the reduced component count of the touch-sensor 100 assembly, as described above, may realize a compact touch sensor 100 assembly. Although this disclosure describes and illustrates particular benefits of bonding particular electrical component(s) directly to substrate 104 of touch sensor 100, this disclosure contemplates any suitable benefits of bonding the electrical components(s) directly to any suitable substrate of any suitable touch sensor in any suitable manner.

Figure 2B:
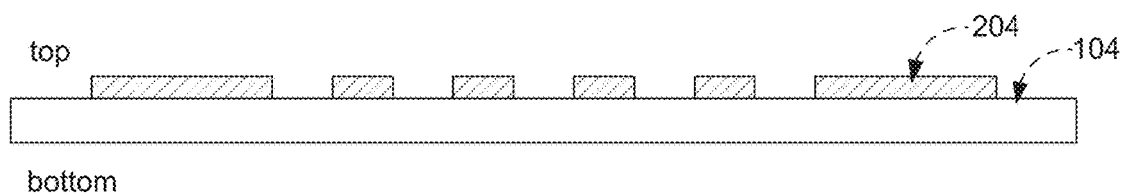
FIGS. 2B-2G illustrate example cross-sectional views of bonding a touch-sensor controller of FIG. 1 to substrate of FIG. 1.
Figure 2C:
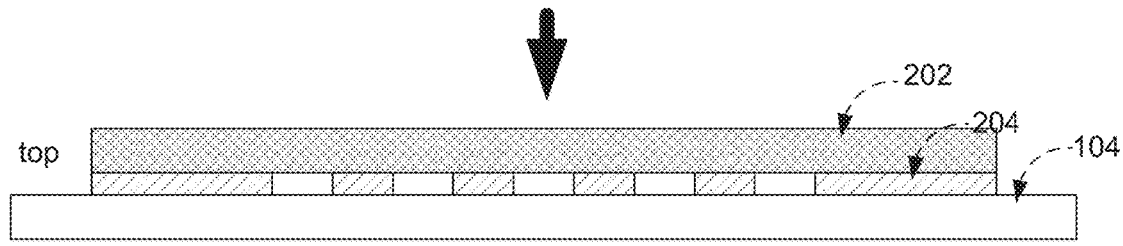
Figure 2D:
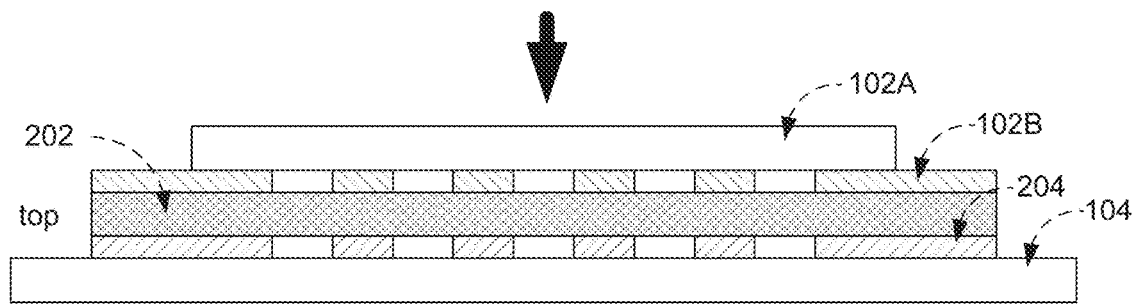
Figure 2E:
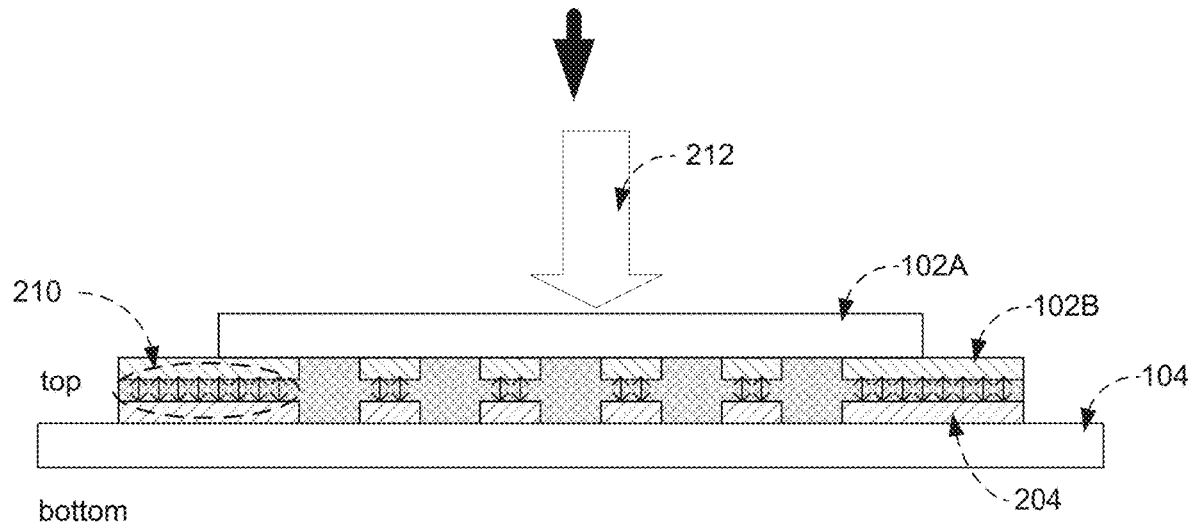
Figure 2F:
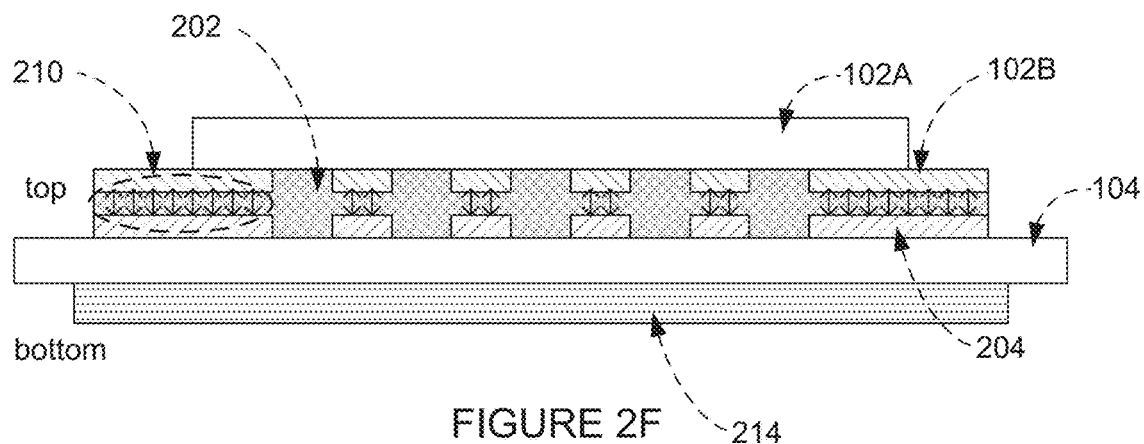
Figure 2G:
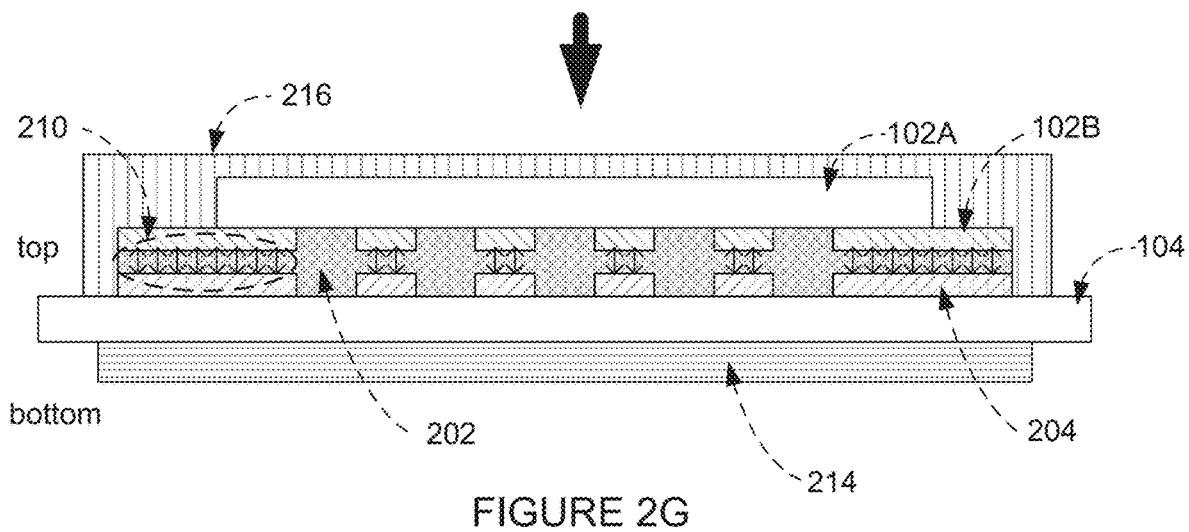

FIGS. 2B-2G (not necessarily shown to scale) illustrate example cross-sectional views of bonding touch-sensor controller 102 to a double-sided substrate 104. In the example of FIG. 2B, tracks 108 of conductive material forming bonding pads 204 may be disposed on a top-side of substrate 104. In particular embodiments, bonding pads 204 may be disposed on a pre-determined portion of the top-side of substrate 104. As an example of FIG. 2A and not by way of limitation, the pre-determined portion of substrate 104 may be a tail portion of substrate 104, as described above. Furthermore, bonding pads 204 may be disposed using a pre-determined pattern on substrate 104, as described above. As an example of FIG. 2A and not by way of limitation, the pre-determined pattern may be associated with the pins and outline of touch-sensor controller 102. As an example of FIGS. 2B-2G and not by way of limitation, touch-sensor controller 102 has a QFN packaging footprint and bonding pads 204 may be arranged in association with the QFN packaging footprint, As another example and not by way of limitation, touch-sensor controller 102 (or any other active electrical component) may have a BGA packaging footprint and bonding pads 204 may be arranged in association with the BGA packaging footprint. In the example of FIG. 2C, ACF 202 may be disposed on bonding pads 204. In particular embodiments, a shape and a size of ACF 202 as applied may depend at least on the pre-determined pattern of bonding pads 204 as disposed. In the example of FIG. 2D, touch-sensor controller 102 comprising the associated packaging 102A and pins 102B may be disposed on ACF 202. In particular embodiments, touch-sensor controller 102 may be disposed such that pins 102B may be aligned with associated bonding pads 204 on substrate 104. In the example of FIG. 2E, a combination of at least a pre-determined pressure and pre-determined elevated temperature cycles 212 may be applied on touch-sensor controller 102 in a controlled environment. Application of the pre-determined pressure 212 may allow conductive particles of ACF 202 to form electrical interconnects 210 between pins 102B of touch-sensor controller 102 and associated bonding pads 204. As an example and not by way of limitation, the pre-determined pressure 212 may be approximately 3 Megapascals (MPa). Electrical interconnects 210 may allow for flow of electrical current between pins 102B and associated bonding pads 204 anisotropically. Furthermore, application of the pre-determined elevated temperature cycles 212 may allow the epoxy constituent of ACF 202 to reflow and form an adhesive bridge joining touch-sensor controller 102 to the associated bonding pads 204 and substrate 104. As an example and not by way of limitation, the pre-determined elevated temperature cycles 212 may be applied to touch-sensor controller 102 at approximately 150° C. (i.e. within a range of 140° C. to 190° C.). In the example of FIG. 2F, a stiffener 214 is applied to a bottom-side of substrate 104. Furthermore, the stiffener 214 may be located substantially opposite to touch-sensor controller 102 (with respect to substrate 104). In particular embodiments, excessive flexure, strain, or twist of ACF 202 between touch-sensor controller 102 and substrate 104 may cause bond pads 204 to delaminate from pins 102B of touch-sensor controller 102. As an example and not by way of limitation, referencing FIG. 2F, applying stiffener 214 to the bottom-side of substrate 104 may substantially minimize such flexure, strain, or twist of ACF 202. Furthermore, stiffener 214 may provide an environmental barrier to prevent water from diffusing through substrate 104 from the bottom-side of substrate 104 and affecting a structural integrity of ACF 202. In the example of FIG. 2G, touch-sensor controller 102 may be encapsulated by encapsulant 216. In particular embodiments, the encapsulant 216 may include any suitable combination of one or more of epoxy-, silicone-, and polyimide-based materials. In particular embodiments, depending on pre-determined requirements of adhesion, protection, and accessibility with regards to touch-sensor 102, encapsulant 216 may cover the entire or selected areas of touch-sensor controller 102. As an example and not by way of limitation, in order to increase adhesion between touch-sensor controller 102 and substrate 104 (a.k.a. reduce stress on ACT 202) and provide an environmental barrier at all sides of touch-sensor controller 102, encapsulant 216 may cover the entire touch-sensor controller 102. In particular embodiments, encapsulant 216 may be optically opaque or clear. As an example, an optically-clear encapsulant 216 may allow touch-sensor controller 102 to be visually inspected. Furthermore, carbon-based ink (not shown in the figures) may be printed over the exposed tracks 108 and bonding pads 204. Such carbon-based ink may provide an additional conductive, corrosion-resistance, and environmental stable coating over the tracks 108 and bonding pads 204. Although this disclosure describes and illustrates particular steps of bonding touch-sensor controller 102 to substrate 104 of touch sensor 100, this disclosure contemplates any suitable combination of one or more suitable steps of bonding any suitable touch-sensor controller to any suitable substrate of any suitable touch sensor in any suitable manner. Moreover, although this disclosure describes and illustrates particular components, devices, or systems carrying out particular steps of FIGS. 2B-2G, this disclosure contemplates any suitable combination of any suitable components, devices, or systems carrying out any suitable steps of FIGS. 2B-2G.

Figure 3:
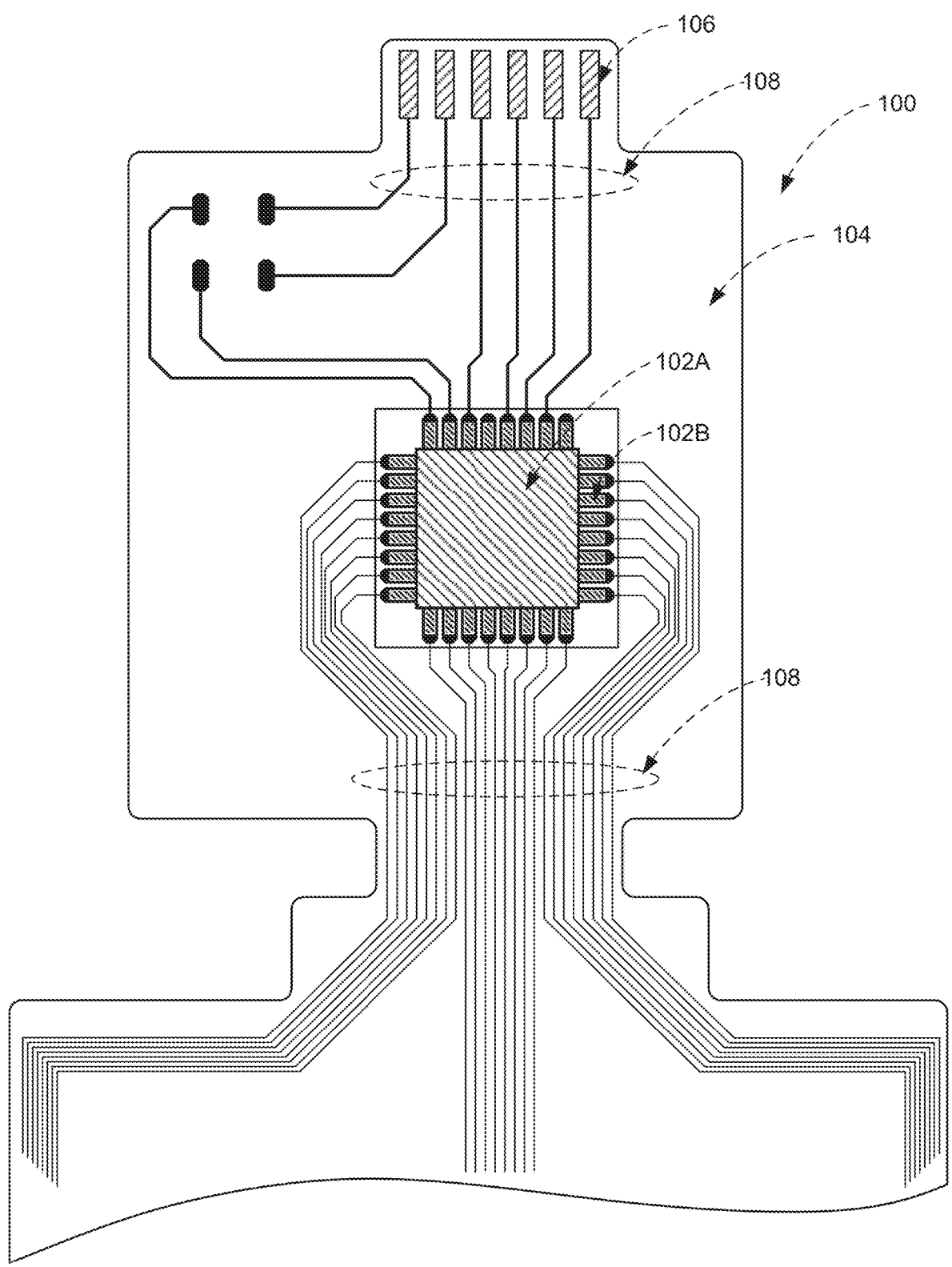
FIG. 3 illustrates another example view of touch sensor of FIG. 1.

FIG. 3 (not necessarily shown to scale) illustrates another example view of touch sensor 100. In the example of FIG. 3, touch-sensor controller 102 is bonded on substrate 104 and tracks 108 extend outwards from pins 102B of touch-sensor controller 102 to connect to various other components on touch sensor 100. As an example of FIG. 3 and not by way of limitation, a first portion of tracks 108 from pins 102B may be connected to connection pads 106. As another example of FIG. 3 and not by way of limitation, a second portion of tracks 108 from pins 102B may be connected to electrodes in touch-sensitive area 110 (not shown in FIG. 3) of touch sensor 100. Although this disclosure describes and illustrates particular layout of particular electrical components and particular tracks on substrate 104 of touch sensor 100, this disclosure contemplates any suitable layout of any suitable combination of one or more of any suitable electrical component and any suitable combination of one or more of any suitable track on any suitable substrate of any suitable touch sensor.

Figure 4:
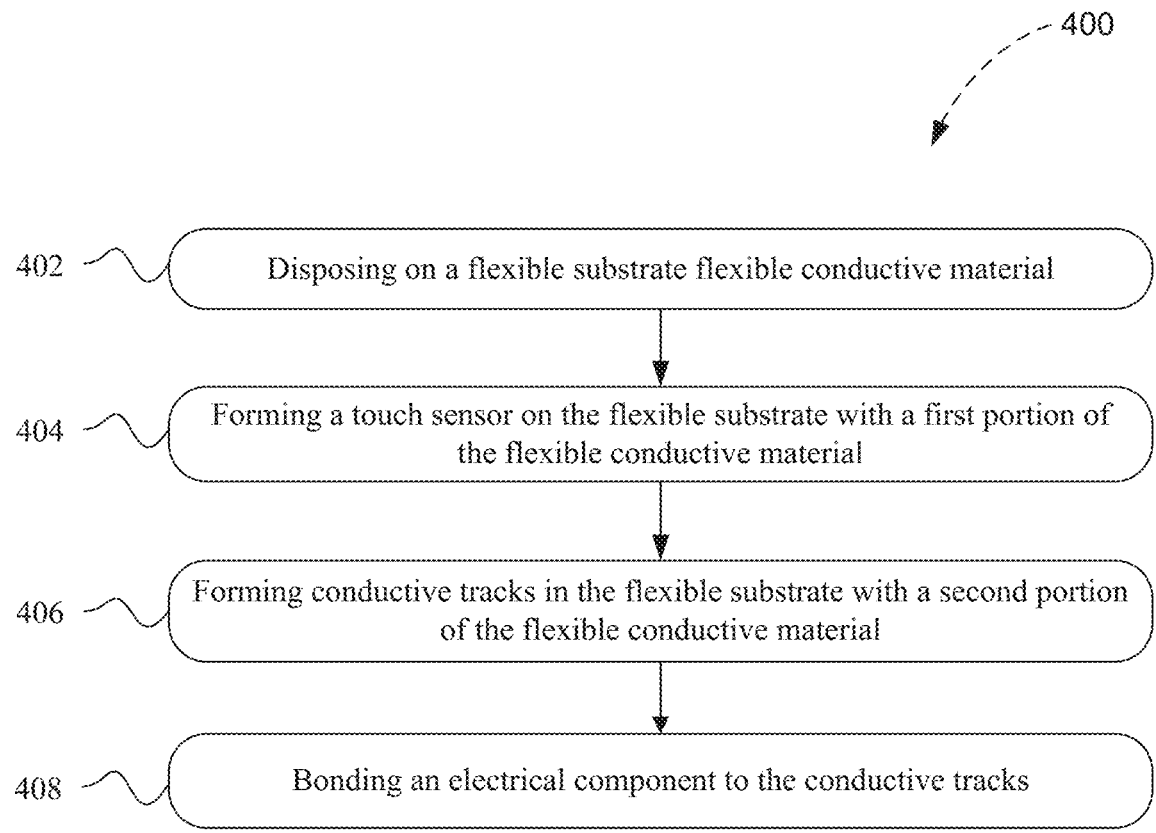
FIG. 4 illustrates an example method for bonding an electrical component to conductive tracks of a touch sensor.

FIG. 4 illustrates example method 400 for bonding an electrical component to conductive tracks of a touch sensor. In step 402 of FIG. 4, flexible conductive material is disposed on a flexible substrate. As an example and not by way of limitation, the flexible conductive material may be made of for example copper, silver, carbon, or a copper-, silver-, or carbon-based material, as described above. As another example and not by way of limitation, the flexible substrate may be made of PET or a material having a low birefringence, as described above. In particular embodiments, one or more flexible conduction materials may be disposed on the flexible substrate. As an example and not by way of limitation, the one or more flexible conductive materials may be made of any suitable combination of one or more of an ITO, copper, silver, carbon, or a copper-, silver-, or carbon-based material. In other particular embodiments, one or more flexible conductive material may be disposed on multiple substrate(s). In step 404 of FIG. 4, a touch sensor is formed on the flexible substrate with a first portion of the flexible conductive material. As an example of FIG. 1 and not by way of limitation, touch sensor 100 may be formed on flexible substrate 104. As another example of FIG. 1 and not by way of limitation, touch sensor 100 may comprise touch-sensitive area 110 as disposed on flexible substrate 104. Touch-sensitive area 110 may include an array of drive and sense electrodes (or an array of electrodes of a single type), as described above. Furthermore, the array of drive and sense electrodes may form the first portion of the flexible conductive material. In particular embodiments, the drive or sense electrodes in touch-sensitive area 110 may be made of ITO in whole or in part. In other particular embodiments, the drive or sense electrodes in touch-sensitive area 110 may be made of FLM, as described above. In step 406 of FIG. 4, conductive tracks are formed on the flexible substrate with a second portion of the flexible conductive material. As an example of FIG. 1 and not by way of limitation, tracks 108 may be formed on flexible substrate 104. Tracks 108 may be used for coupling various components associated with touch sensor 100. Tracks 108 may even form bonding pads 104 for electrically and mechanically bonding external electrical component(s) to substrate 104, as described above. As an example of FIG. 1 and not by way of limitation, tracks 108 may couple the array of drive and sense electrodes of touch-sensitive area 110 in touch sensor 100 to bonded touch-sensor controller 102. As another example of FIG. 1 and not by way of limitation, tracks 108 may couple bonded touch-sensor controller 102 to connection pads 106. As yet another example and not by way of limitation, the flexible conductive material may be made of FLM as described above; and the array of drive and sense electrodes may be formed from the first portion of the flexible conductive material as described above. In contrast, tracks 108 may be formed from the second portion of the flexible conductive material. In step 408 of FIG. 4, an electrical component is bonded to the conductive tracks. As an example of FIG. 2 and not by way of limitation, the electrical component may be touch-sensor controller 102. In particular embodiments, the conductive tracks electrically couple the electrical component to the touch sensor in step 404. As an example of FIG. 2 and not by way of limitation, tracks 108 form bonding pads 204 and touch-sensor controller 102 may be bonded to bonding pads 204. As another example of FIGS. 2B-2G and not by way of limitation, the flexible substrate 104 is double-sided and touch-sensor controller 102 may be bonded to tracks 108 that extend along a top-side of the flexible substrate 104. In particular embodiments, a carbon-based ink (or any other suitable ink) may be used as a coating over tracks 108, connection pads 106, and bonding pads 204 that are substantially exposed to environmental elements such as, for example moisture and oxygen. The carbon-based ink coating may provide an additional conductive, corrosion-resistance, and environmental stable coating for the tracks 108, connection pads 106, and bonding pads 204, as described above. In particular embodiments, touch-sensor controller 102 may be bonded to bonding pads 204 and substrate 104 using an adhesive and anisotropic conductive material such as ACF 202, as described above. In particular embodiments, referencing FIG. 2E, a pre-determined pressure and one or more elevated temperature cycles 212 may be applied to touch-sensor controller 102 to form mechanical and electrical bonds between pins 102B of touch-sensor controller 102 and bonding pads 204. In particular embodiments, referencing FIG. 2F, a stiffener may be applied to a bottom-side of the flexible substrate. The stiffener may provide an environmental barrier to prevent water from diffusing through substrate 104 from the bottom-side of substrate 104 and affecting a structural integrity of ACF 202. In particular embodiments, In particular embodiments, the electrical component may be encapsulated. As an example of FIG. 2G and not by way of limitation, the electrical component may be encapsulated by encapsulant 216. In particular embodiments, the encapsulant 216 may include any suitable combination of one or more of epoxy-, silicone-, and polyamide-based materials, as described above. Although this disclosure describes and illustrates particular steps of bonding particular electrical component to particular conductive tracks of particular touch sensor, this disclosure contemplates any suitable combination of one or more of a suitable step of bonding any suitable electrical component to any suitable conductive tracks of any suitable touch sensor in any suitable manner. Moreover, although this disclosure describes and illustrates particular components, devices, or systems carrying out particular steps of FIG. 4, this disclosure contemplates any suitable combination of any suitable components, devices, or systems carrying out any suitable steps of FIG. 4.

Figure 5:
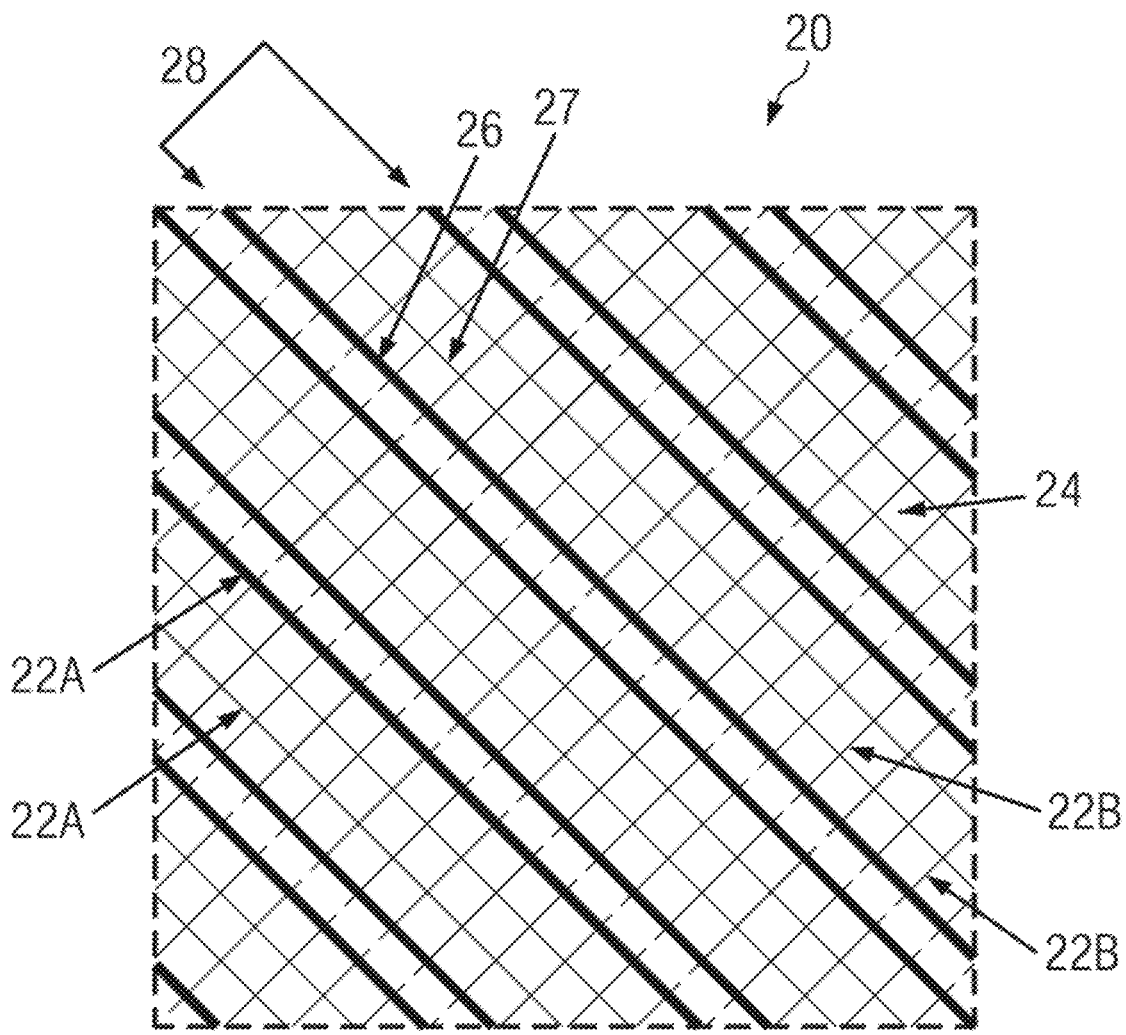
FIG. 5 illustrates an example mesh pattern of a touch-sensitive mesh layer.

FIG. 5 illustrates an example mesh pattern of a touch-sensitive mesh layer. As discussed above, an electrode may be made of fine lines 22A-B of metal or other conductive material (for example, copper, silver, carbon, or a copper-, silver-, or carbon-based material) and the lines 22A-B of conductive material may occupy the area of the electrode shape in a hatched, mesh, or other suitable pattern. In the example of FIG. 5, an example mesh pattern 20 of a touch-sensitive mesh layer is formed from substantially straight lines 22A-B of conductive material. Mesh pattern 20 may be formed using two sets 22A-B of substantially parallel lines of conductive material. Mesh pattern 20 may also be made up of an array of polygon-shaped mesh cells 24 formed from substantially orthogonal intersections between lines 22A with lines 22B of conductive material. In particular embodiments, first set 22A and second set 22B of conductive lines may be disposed such that a total line density is less than approximately 10% of a surface area. Thereof, the contribution of the conductive lines to the reduction of transmission of light through mesh pattern 20 may be less than approximately 10%. In particular embodiments, the conductive lines may result in an attenuation of, for example, 3-10% of the transmission of light through mesh pattern 20.

In the example of FIG. 5, example mesh pattern 20 of the touch-sensitive mesh layer further includes one or more conductive lines 22A-B that have a width that is greater than a width of one or more other conductive lines 22A-B. As an example and not by way of limitation, mesh pattern 20 may include a conductive line 26 and a conductive line 27 (which are examples of two of conductive lines 22A-B). Conductive line 26 may have a width that is greater than the width of conductive line 27. In particular embodiments, conductive line 27 may have any width that is less than the width of conductive line 26. As an example and not by way of limitation, if the width of conductive line 26 is 5 μm, conductive line 27 may have any width that is less than 5 μm, such as 4 μm, 3 μm, 2 μm, or any other width that is less than 5 μm. In particular embodiments, because conductive line 27 has a width that is less than the width of conductive line 26, the total line density of example mesh pattern 20 may be reduced. As such, the reduced width of conductive line 27 may increase the transmittance in a device utilizing example mesh pattern 20.

In the example of FIG. 5, example mesh pattern 20 of a touch-sensitive mesh layer further includes one or more electrodes, such as, for example, electrode 28. In particular embodiments, electrode 28 may include a plurality of conductive lines 22A-B. Furthermore, in particular embodiments, one or more of the conductive lines 22A-B may be primary conductive lines while one or more of the conductive lines 22A-B may be secondary conductive lines. In particular embodiments, the width of the secondary conductive lines may be less than that of the primary conductive lines. As an example and not by way of limitation, conductive line 26 (which may have a width that is greater than that of conductive line 27) may be a primary conductive line, while conductive line 27 may be a secondary conductive line. In particular embodiments, since the primary conductive lines have a greater width than that of the secondary conductive lines, if one or more of the secondary conductive lines break (or are otherwise unable to carry an alternating voltage or charge), the primary conductive lines and the remaining secondary conductive lines may still carry the alternating voltage applied to a drive electrode or the charge induced on a sense electrode. As such, the primary conductive lines and remaining secondary conductive lines may still provide a suitable level of electrical connectivity across mesh pattern 20. Electrode 28 may have any suitable pattern for the primary conductive lines and secondary conductive lines. As an example and not by way of limitation, the primary conductive lines of electrode 28 may be the outermost conductive lines of electrode 28, while the secondary conductive lines of electrode 28 may be the innermost conductive lines of electrode 28.

Although this disclosure describes or illustrates particular mesh patterns, this disclosure contemplates any suitable mesh pattern formed using conductive lines with any suitable configuration. As an example and not by way of limitation, a mesh pattern may include any particular pattern of conductive lines, any particular pattern of primary conductive lines, any particular pattern of secondary conductive lines, and any particular pattern of electrodes.

Herein, reference to a computer-readable non-transitory storage medium or media may include one or more semiconductor-based or other integrated circuits (ICs) (such, as for example, a field-programmable gate array (FPGA) or an application-specific IC (ASIC)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards, SECURE DIGITAL drives, any other suitable computer-readable non-transitory storage medium or media, or any suitable combination of two or more of these, where appropriate. A computer-readable non-transitory storage medium or media may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, functions, operations, or steps, any of these embodiments may include any combination or permutation of any of the components, elements, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A method, comprising: forming a touch sensor on a main portion of a flexible substrate;
    bonding an electrical component to a tail portion of the flexible substrate, wherein conductive tracks electrically couple the electrical component to the touch sensor;
    arranging bonding pads on the flexible substrate in a pattern associated with pins of the electrical component, wherein the bonding pads are bonded to the pins using an electrically conductive material; and
    forming electrical interconnects between the bonding pads and the pins using conductive particles of the electrically conductive material,
    wherein the touch sensor is a single-layer configuration such that electrodes are disposed only on one surface of the flexible substrate,
    the electrodes each comprise conductive fine lines,
    one or more of the conductive fine lines which are primary conductive fine lines have a width that is greater than a width of one or more other of the conductive fine lines which are secondary conductive fine lines,
    the primary conductive fine lines which are outermost conductive fine lines of the electrode are parallel with the secondary conductive fine lines which are innermost conductive fine lines of the electrode,
    the flexible substrate further comprises a connection portion connected between the tail portion and the main portion in a first direction from a touch-sensor controller to the touch sensor, and
    in a second direction, perpendicular to the first direction, a size of the tail portion is smaller than a size of the main portion and is larger than two different sizes of the connection portion,
    wherein the flexible substrate is provided with two pairs of terminals, which are separated and opposite to each other, and connection pads arranged on a side of the tail portion away from the main portion, one pair of terminals of the two pairs of terminals is connected with two of the connection pads via two of the conductive tracks, and the other pair of terminals of the two pairs of terminals is connected with two of the bonding pads via another two of the conductive tracks.

2. The method of claim 1, wherein the flexible substrate comprises polyethylene terephthalate (PET).

3. The method of claim 1, wherein the electrically conductive material comprises at least one of anisotropic conductive paste (ACP), anisotropic conductive film (ACF), and conductive epoxy.

4. The method of claim 1, wherein the electrical component is an integrated circuit (IC) encased in packaging.

5. The method of claim 1, wherein the electrodes comprise drive electrodes and sense electrodes that are configured to capacitively couple to each other to form capacitive nodes.

6. The method of claim 1, wherein each of the conductive tracks comprises at least one of a copper-based material, a silver-based material, and a carbon-based material.

7. The method of claim 1, wherein the flexible substrate has a thickness between 50 and 200 µm.

8. The method of claim 1, wherein forming the electrical interconnects comprises applying a pre-determined pressure to the electrical component.

9. A device, comprising:
    a flexible substrate comprising a main portion and a tail portion; a touch sensor disposed on the main portion;
    an electrical component bonded to the tail portion, wherein conductive tracks electrically couple the electrical component to the touch sensor;
    bonding pads arranged on the flexible substrate in a pattern associated with pins of the electrical component, wherein the bonding pads are bonded to the pins using an electrically conductive material; and
    electrical interconnects formed between the bonding pads and the pins by conductive particles of the electrically conductive material,
    wherein:
    the touch sensor is a single-layer configuration such that electrodes are disposed only on one surface of the flexible substrate,
    the electrodes each comprise conductive fine lines,
    one or more of the conductive fine lines which are primary conductive fine lines have a width that is greater than a width of one or more other of the conductive fine lines which are secondary conductive fine lines,
    the primary conductive fine lines which are outermost conductive fine lines of the electrode are parallel with the secondary conductive fine lines which are innermost conductive fine lines of the electrode
    the flexible substrate further comprises a connection portion connected between the tail and the main portion in a first direction from a touch-sensor controller to the touch sensor, and
    in a second direction, perpendicular to the first direction, a size of tail portion is smaller than a size of the main portion and is larger than two different sizes of the connection portion,
    wherein the flexible substrate is provided with two pairs of terminals, which are separated and opposite to each other, and connection pads arranged on a side of the tail portion away from the main portion, one pair of terminals of the two pairs of terminals is connected with two of the connection pads via two of the conductive tracks, and the other pair of terminals of the two pairs of terminals is connected with two of the bonding pads via another two of the conductive tracks.

10. The device of claim 9, wherein the flexible substrate comprises polyethylene terephthalate (PET).

11. The device of claim 9, wherein the electrically conductive material comprises at least one of anisotropic conductive paste (ACP), anisotropic conductive film (ACF), and conductive epoxy.

12. The device of claim 9, wherein the electrical component is an integrated circuit (IC) encased in packaging.

13. The device of claim 9, wherein the electrodes comprise drive electrodes and sense electrodes that are configured to capacitively couple to each other to form capacitive nodes.

14. The device of claim 9, wherein primary conductive fine lines and the secondary conductive fine lines are configured to carry a voltage applied to the electrode if any one of the primary conductive fine lines and the secondary conductive fine lines is unable to carry the voltage or charge.

15. The device of claim 9, wherein, the touch-sensor controller is encapsulated by an encapsulant which is optically clear.

16. The device of claim 9, wherein each of the conductive tracks comprises at least one of a copper-based material, a silver-based material, and a carbon-based material.

17. The device of claim 9, wherein the flexible substrate has a thickness between 50 and 200 μm.

* * * * *